United States Patent
Xing et al.

(10) Patent No.: US 8,035,389 B2
(45) Date of Patent: Oct. 11, 2011

(54) RF SWITCH DEVICE, MAGNETIC RESONANCE IMAGING SYSTEM AND AN RF SIGNAL TRANSMISSION METHOD

(75) Inventors: Yao Xing, Shenzhen (CN); Yang Wang, Shenzhen (CN); Yan Hong Chen, Shenzhen (CN); Hua Bin Zhu, Shenzhen (CN); Jian Min Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 286 days.

(21) Appl. No.: 12/347,348

(22) Filed: Dec. 31, 2008

(65) Prior Publication Data
US 2009/0174498 A1   Jul. 9, 2009

(30) Foreign Application Priority Data
Jan. 4, 2008   (CN) .......................... 2008 1 0000039

(51) Int. Cl.
*G01V 3/00*   (2006.01)
(52) U.S. Cl. ...................................... 324/322
(58) Field of Classification Search .......... 324/300–322; 600/410–435; 333/219–235
See application file for complete search history.

(56) References Cited

U.S. PATENT DOCUMENTS

| | | | | |
|---|---|---|---|---|
| 7,026,818 B2 * | 4/2006 | Machida et al. | ............... | 324/322 |
| 7,176,689 B2 * | 2/2007 | Machida et al. | ............... | 324/318 |
| 7,535,230 B2 * | 5/2009 | Takagi | .......................... | 324/318 |
| 7,782,057 B2 * | 8/2010 | Okamoto et al. | ............. | 324/318 |

* cited by examiner

*Primary Examiner* — Dixomara Vargas
(74) *Attorney, Agent, or Firm* — Schiff Hardin LLP

(57) ABSTRACT

A radio frequency (RF) switch device has at least two RF switch units, each RF switch unit having an output terminal and at least two input terminals. The RF switch units select one channel of RF signals from several channels of the RF signals that are supplied as inputs to their input terminals for emission as an output from their output terminals. A magnetic resonance imaging system and an RF signal transmission method employ such an RF switch device. The use of such an RF switch device reduces the number of channels of the RF signals that need to be further transmitted, which in turn reduces the number of the corresponding long RF cable channels and the number of channels of the subsequent devices, thereby preventing waste and reducing the cost of the system. Moreover, if the subsequent devices include a receiver coil channel selector, then the complexity of the receiver coil channel selector will also be reduced as the number of RF signal channels is decreased.

6 Claims, 5 Drawing Sheets

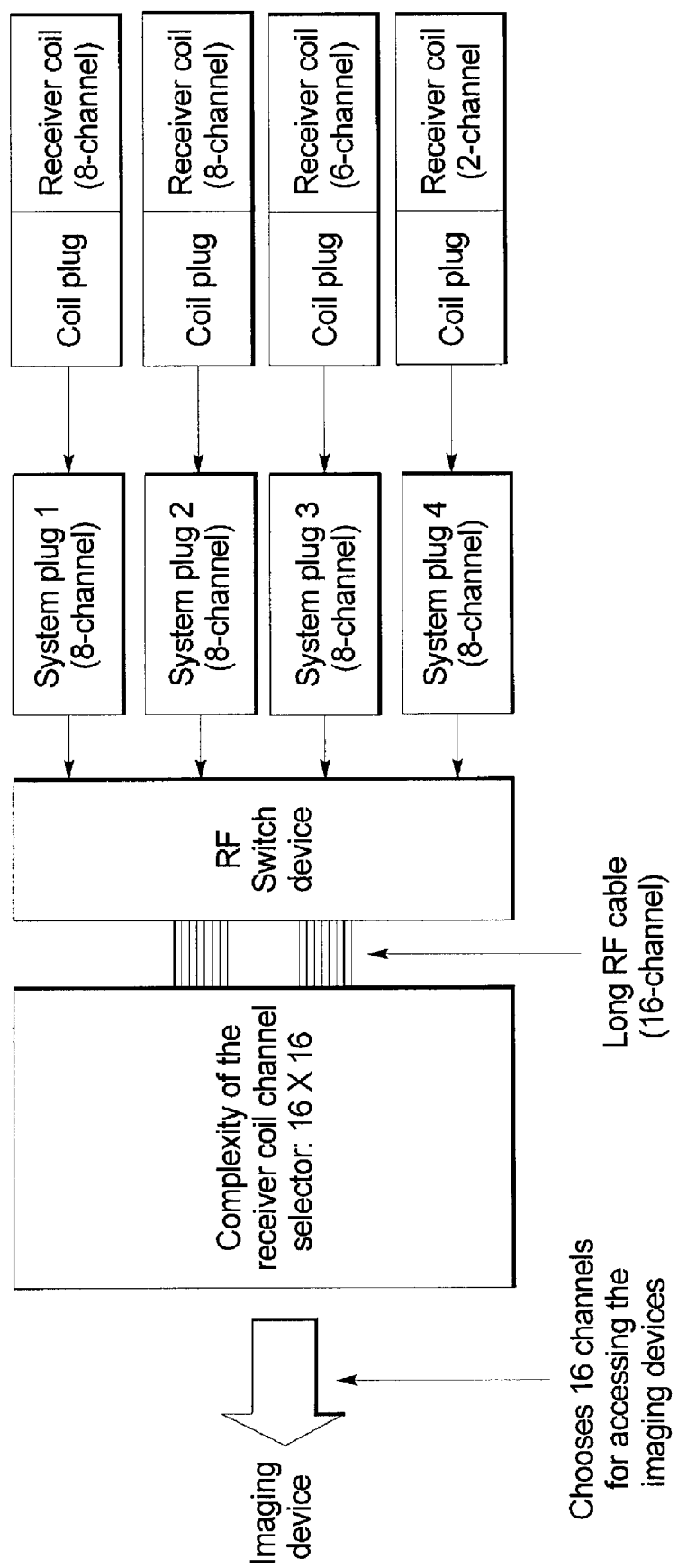

RF SWITCH DEVICE, MAGNETIC RESONANCE IMAGING SYSTEM AND AN RF SIGNAL TRANSMISSION METHOD

BACKGROUND OF THE INVENTION

1. Field of the Invention

The present invention relates to the field of RF signal transmission, and more particularly to an RF switch device, a magnetic resonance imaging system and an RF signal transmission method.

2. Description of the Prior Art

As shown in FIG. 1, in the magnetic resonance imaging system, the receiver coil receives the RF signals emitted from the human body, and the received signals are connected to the system plug via the coil plug of the receiver coil. The system plug is connected with the receiver coil channel selector via the long RF cable, and the receiver coil channel selector chooses the 16-channel RF signals suitable for the imaging device from the inputted RF signals to feed to the imaging device to form the corresponding images from processing of the RF signals.

In order to achieve better signal noise ratio, most of the existing receiver coils are arranged in a coil array, and therefore each receiver coil includes multiple units. Moreover, to meet the needs of clinic application, the magnetic resonance imaging system allows for connection of multiple coils simultaneously. To achieve this, it is necessary to provide a large number of corresponding RF channels.

Taking the structure shown in FIG. 1 as an example, the magnetic resonance imaging system provides 4 system plugs of 8-channel RF signals, so that up to 32 channels of RF signals can be fed to the receiver coil channel selector, and then the 16-channel RF signals are outputted to the imaging device after being selected by the receiver coil channel selector. As shown in FIG. 1, the complexity of the receiver coil channel selector is 32×16, which is very complicated. In addition, an expensive 32-channel long RF cable is needed to connect the system plug to the receiver coil channel selector. Obviously, such a structure not only makes the circuits of the system very complicated, but also leads to a very high cost.

Normally, since both the system plug and coil plug are of a fixed design, the coil 3 containing the 6-channel RF signals and the coil 4 containing the 2-channel RF signals as shown in FIG. 1 cannot be simultaneously connected to either system plug 3 or system plug 4, but can be only separately connected to the plug 3 and plug 4. As a result, 8 RF channels in the plug 3 and plug 4 are idle. In this case, 8 RF channels in the long 32-channel RF cable are also idle, causing huge waste.

SUMMARY OF THE INVENTION

In order to reduce the system cost, the present invention provides an RF switch device, a magnetic resonance imaging system and an RF signal transmission method.

The RF switch device provided by the present invention has at least two RF switch units, in which each RF switch unit comprises an output terminal and at least two input terminals, and the RF switch units choose one channel of the RF signals from several channels of the RF signals which are inputted into their input terminals for outputting from their output terminals.

The RF switch unit may have an RF switch with two input terminals and one output terminal. The input terminals of the RF switch are used as the input terminals of the RF switch unit, the output terminal of the RF switch is used as the output terminal of said RF switch unit, and the RF switch chooses one channel of the RF signal from the RF signals supplied to its input terminals for use as an output from its output terminal.

The RF switch unit may include at least two RF switches, each of which has one input terminal and two output terminals. The input terminals of the RF switches are used as the input terminals of the RF switch unit, and the two output terminals of the RF switch are respectively connected with a resistor to ground and the output terminal of the RF switch unit. In this case, one RF switch emits the RF signal that was supplied to its input terminal to the output terminals of the RF switch unit, and the remaining RF switches output the RF signals, which were supplied to their input terminals, to ground.

The RF switch unit may include at least four RF switches, and the at least four RF switch units are divided into at least two stages. Each RF switch has one input terminal and two output terminals. The input terminal of the first-stage RF switch is used as the input terminal of the RF switch unit. At the various stages preceding the last stage, one output terminal of each RF switch is connected with to ground, the other output terminal and one output terminal of another RF switch at the same stage are jointly connected with the input terminals of the same RF switch at the next stage. One RF switch of the two RF switches that are connected to the same RF switch at the next stage outputs the RF signal supplied to its input terminal to the RF switch at the next stage. Another RF switch outputs the RF signal supplied to its input terminal to ground. If the number of the RF switches at the same stage is odd, the remaining RF switch operates as the RF switch at the next stage. At the last stage, the two output terminals of each RF switch are separately connected to ground and the output terminal of the RF switch unit. One RF switch at the last stage outputs the RF signals supplied to its input terminal to the output terminal of the RF switch unit, and the other RF switch outputs the RF signals supplied to its input terminal to ground.

At least two sets of RF signals are supplied as inputs to a set of the RF switch units in the RF switch device, and each change of the RF signals is respectively supplied to one input terminal of the set of RF switch units. The set of RF switch units chooses at least one set the RF signals from the input RF signals for emission in part or in full as an output.

The RF switch further has a control terminal for controlling the relation between the input and output of said RF switch.

The RF unit in the RF switch device according to the present invention can choose the RF signals from one of its input terminals for emission as an output, thereby decreasing the number of channels of the RF signals that need to be further transmitted, which in turn reduces the number of the corresponding long RF cable channels and the number of channels of the subsequent devices, thus preventing waste and reducing the cost of the system. Moreover, if the subsequent devices include a receiver coil channel selector, then the complexity of the receiver coil channel selector will also be reduced as the number of the RF signal channels is decreased.

The present invention further encompasses a magnetic resonance imaging system, having an imaging device and at least two system plugs that are connected with the receiver coil. The magnetic resonance imaging system further includes one of the aforesaid RF switch devices in which the input terminals of the RF switch units in the RF switch device are respectively connected with one RF signal channel in the system plugs, and the output terminal of the RF switch unit is connected with the imaging device.

The magnetic resonance imaging system further has a receiver coil channel selector, which is connected between the RF switch device and the imaging device, that selects the RF signals suitable for the imaging device from among the RF signals emitted as outputs from the RF switch device, and supplies the selected signal to the imaging device.

The RF signals from at least two system plugs are supplied as inputs to one set of the RF switch units in the RF switch device, and the set of the RF switch units selects the RF signals from at least one system plug for emission in part or in full as outputs.

In the magnetic resonance imaging system according to the present invention, the aforesaid RF switch device is used to decrease the number of channels of the RF signals that need to be further transmitted, which in turn reduces the number of the corresponding long radio cable channels and the number of channels of the subsequent devices to avoid waste and reduce the cost of the system. Moreover, if the magnetic resonance imaging system includes a receiver coil channel selector, then the complexity of the receiver coil channel selector is reduced with the decrease of the number of the RF signal channels.

The present invention further encompasses an RF signal transmission method, including the steps of supplying at least two sets of RF signals as inputs to an RF switch device, selecting at least one set of the RF signals from the input RF signals for emission in part or in full as an output.

The first step can include respectively supplying the RF signals needed as outputs from a set of RF signals to different RF switch units in the RF switch device, and supplying RF signals not required as outputs from other sets of RF signals into the RF switch unit.

The RF signal transmission method provided by the present invention can decrease the number of channels of the RF signals that need to be further transmitted, which in turn decreases the number of the corresponding RF cable channels and the number of channels of the subsequent devices to avoid waste and reduce the cost of the system. Moreover, if the subsequent devices include a receiver coil channel selector, then the complexity of the receiver coil channel selector will also be reduced as the number of the RF signal channels is decreased.

BRIEF DESCRIPTION OF THE DRAWINGS

FIG. 2 is a schematic diagram showing the transmission circuit of RF signals in an embodiment according to the present invention.

DESCRIPTION OF THE PREFERRED EMBODIMENTS

Figure 1:
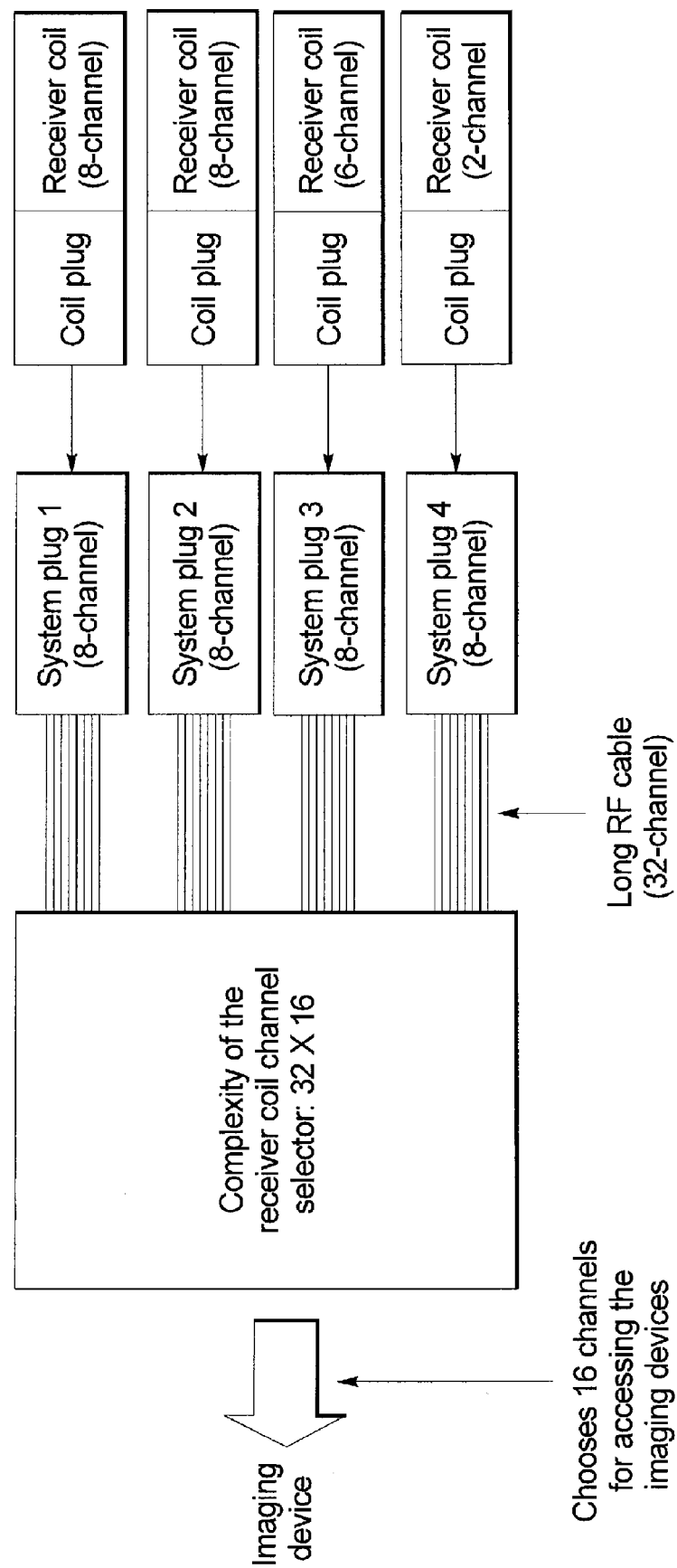
FIG. 1 is a schematic diagram showing the transmission circuit of RF signals in a magnetic resonance imaging system according to prior art.

On the basis of FIG. 1, one embodiment of the present invention adds an RF switch device between the system plug and receiver coil channel selector in the magnetic resonance imaging system, and the schematic diagram of the transmission circuit after addition of the RF switch device is shown in FIG. 2. The RF switch device is connected with the system plug via a short RF cable and selects 16 signal channels from among the 32 signal channels that are output from the system plug, so that only a long 16-channel RF cable is needed for connecting the RF switch device with the receiver coil channel selector. This decreases the number of idle RF cables, thus reducing the cost of the system. In addition, the complexity of the receiver coil channel selector is reduced to 16×16, which greatly decreases the complexity of the system. If the magnetic resonance imaging system does not include a receiver coil channel selector, then the RF switch device can be directly connected to the imaging device via a long RF cable. Furthermore, the RF switch device as described in an embodiment of the present invention eliminates the need for considerable modification of the existing system structure, for example, the need to modify the system plug or receiver coil plug. Therefore, the present invention offers the advantage of easy implementation.

First, the structure of the RF switch device in an embodiment of the present invention is described below.

Figure 3:
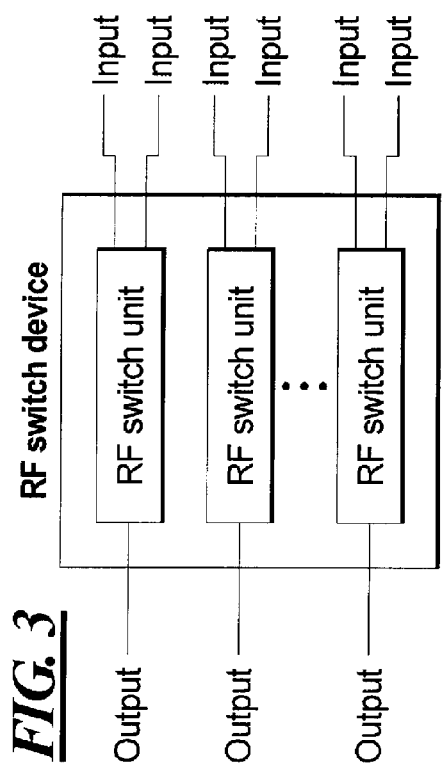
FIG. 3 shows a schematic structure diagram of the RF switch device in an embodiment according to the present invention.

As shown in FIG. 3, the RF switch device in an embodiment of the present invention has at least two RF switch units, each of which has at least two input terminals and one output terminal. In other words, although FIG. 3 only shows two input terminals, the RF switch unit in an embodiment of the present invention may include more than two input terminals. The RF switch unit can choose one channel of the RF signals from several channels of signals supplied as inputs to its input terminals for emission from its output terminal, thus decreasing the number of channels of the RF signals for further transmission and reducing the cost required for subsequent transmission and processing.

Figure 4:
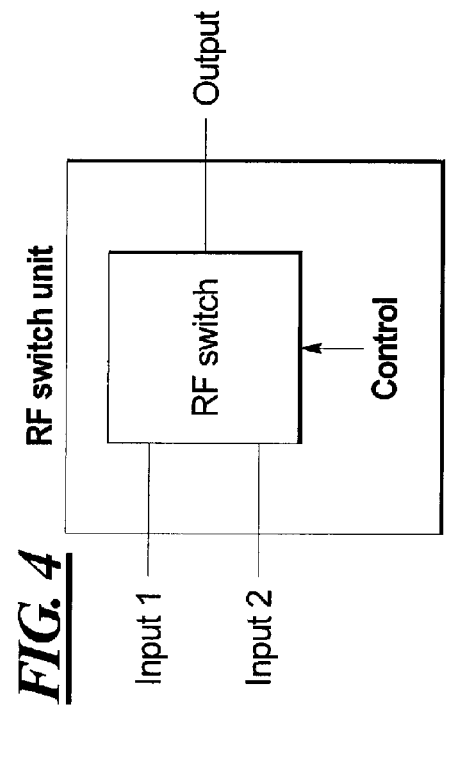
FIG. 4 shows a schematic structure diagram of one RF switch device in an embodiment according to the present invention.

As shown in FIG. 4, the RF switch unit may be implemented by an RF switch. Referring to FIG. 4, the RF switch has two input terminals and one output terminal. The input terminals of the RF switch are used as the input terminals of the RF switch unit for receiving RF signals supplied as inputs to the RF switch unit. The output terminal of the RF switch is connected with the output terminal of the RF switch unit for use as the output terminal of the RF switch unit for output of the RF signals. Two channels of the RF signals are supplied as inputs to the RF switch and the control of the terminal control enables the selection of one channel of the RF signals for output. The RF switch shown in FIG. 4 and other figures has a control terminal for controlling the relation between the input and output, but the RF switch used in the embodiments of the present invention does not necessarily need to have a control terminal. For example, the relation between the input terminal and output terminal can be preset to eliminate the need for control during operation.

Figure 5:
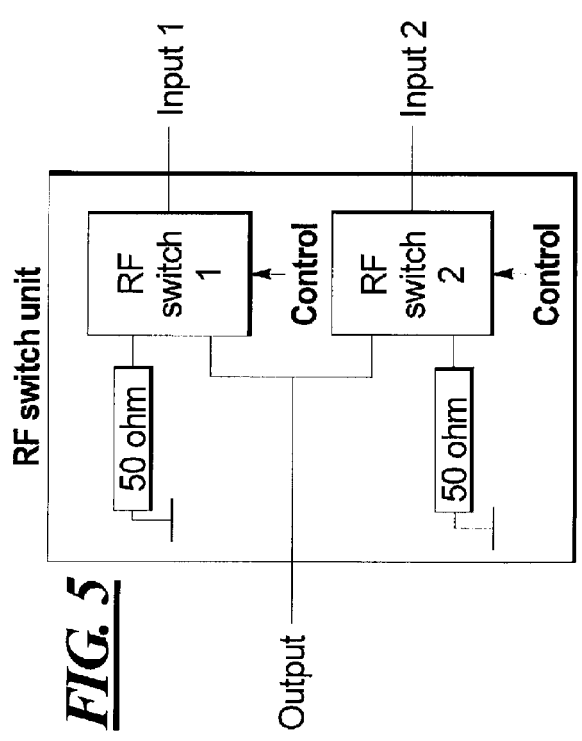
FIG. 5 shows a schematic structure diagram of another RF switch device in an embodiment according to the present invention.

In an RF switch unit implemented by an RF switch as shown in FIG. 4, the unselected RF input would be in the open-circuit state, which will inevitably interfere with other parts of the circuit. In order to eliminate the interference caused by the open-circuit RF, the embodiment of the present invention preferably employs an RF switch unit formed by two RF switches as shown in FIG. 5. For each RF switch, in the structure shown in FIG. 4, one of the two input signal changes in the left side is selected and is emitted as an output from the right side. In the structure shown in FIG. 5, one channel of signals is input from the right side and one of the ports in the left side is selected for emission of output signals. Referring to FIG. 5, the input terminal of each RF switch is used as the input terminal of the RF switch unit for receiving the RF signals inputted into the RF switch unit. For two output terminals of each RF switch, one output terminal is connected to ground through a resistance, and the other output terminal is connected with the output terminal of the RF switch unit for use as the output terminal of the RF switch unit. The resistance value of the grounding resistance shown in FIG. 5 and other figures is 50 ohms, but the present invention is not limited to this value and the value can be 100 ohms or any values suitable for the specific electric circuit.

Taking the input 1 which is the final output of the RF switch unit shown in FIG. 5 as an example, the control terminal of the RF switch 1 controls the signals of the input 1 of the RF switch 1 to output from the output terminal, and the control terminal of the RF switch 2 controls the signals of the input 2 of the RF switch 2 to output to the 50 ohms grounding resistance. As a result, the RF switch unit shown in FIG. 5 selects to output the RF signals of input 1, and the RF signals of input 2 which are not selected for output are absorbed by the grounding resistance to avoid the interference caused by the open-circuit RF signals.

The RF switch used in the aforesaid embodiment can be a mechanical-electrical switch relying on a mechanical contact, or an RF switch relying on a field effect transistor (FET), or an RF switch relying on a positive-intrinsic-negative (PIN) diode. Of course, the present invention is not limited to the aforesaid types of RF switches, and all RF switches capable of the switchover function of the switch can be used to implement the present invention.

In the aforesaid embodiment, the RF switch unit selects one channel from two channels of input signals for outputting, and the present invention can also select one channel from more than two channels of input signals for use as an output to further decrease the complexity of the RF signal selector, thus reducing the number of long RF cable channels and the cost of the system.

In the embodiments below, selecting one channel from three channels of input signals as the output signal is used as an example. For more channels of the RF input signals, those of ordinary skill in the art can clearly understand the specific implementation methods based on the description of the embodiments according to the present invention, and this need not be further detailed herein.

Figure 6:
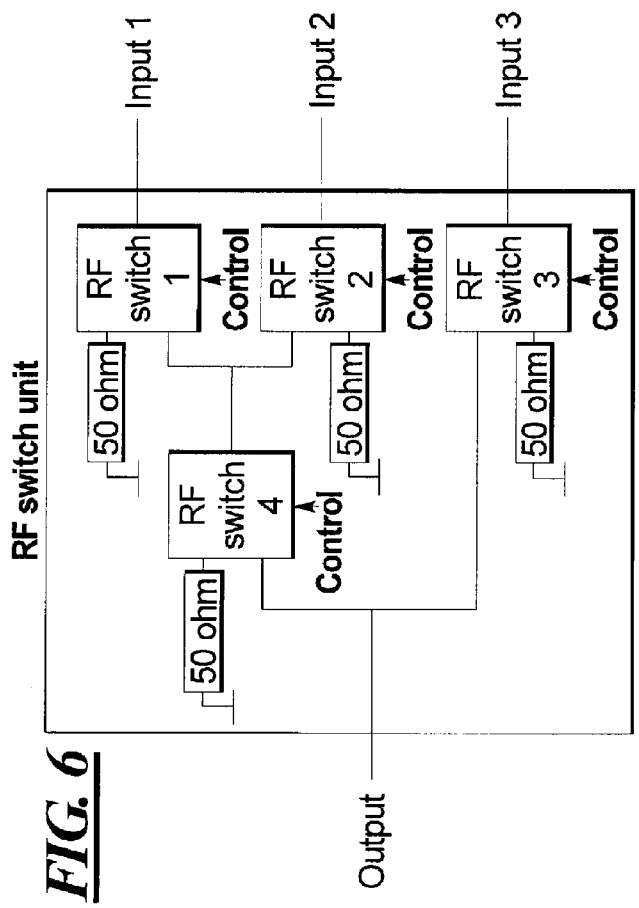
FIG. 6 shows a schematic structure diagram of yet another RF switch device in an embodiment according to the present invention.

Referring to FIG. 6, the RF switch unit has four RF switches, three channels of the input signals are respectively inputted into the RF switch 1, RF switch 2, and RF switch 3; both RF switch 1 and RF switch 2 have an input terminal which is connected to input terminal of RF switch 4, and the other input terminal is connected to ground. Both RF switch 4 and RF switch 3 have an input terminal which is connected with the output terminal of the RF switch unit, and the other input terminal is connected with the grounding resistance. According to the structure and method described in embodiment shown in FIG. 4 or FIG. 5, the RF switch 1 and RF switch 2 select one channel from two channels of signals of input 1 and input 2 to output the signals to the input terminal of the RF switch 4. Then, according to the structure and method described in embodiment as shown in FIG. 4 or FIG. 5, the RF switch 3 and RF switch 4 select one channel from the signals of input 3 and the signals outputted from the RF switch 1 and RF switch 2, and output the signal as the final output signal of the RF switch unit.

For an RF switch unit with a structure similar to those shown in FIG. 6 which has at least four RF switches, these RF switches can be divided into at least two stages in which every two RF switches at each stage are treated as one set. If the number of the RF switches at the same stage is odd, the remaining RF switch is used as the RF switch at the next stage. The input terminal of the first-stage RF switch is used as the input terminal of the RF switch unit to directly receive the RF signals supplied as inputs to the RF switch unit, and the input terminal of each RF switch at other stages is connected with one output terminal of each RF switch in one set of RF switches at the preceding stage. The two input terminals of the last-stage RF switch are respectively connected with the output terminal of the RF switch unit and the grounding resistance. For RF switches at other stages, one input terminal is connected with the grounding resistance, and the other input terminal and one output terminal of the same set of RF switches are jointly connected with the input terminal of the same RF switch at the next stage. During operation, each set of RF switches at the same stage work together to select one channel of RF signals from the two channels of RF input signals and output the signals to the input terminal of the connected RF switch at the next stage, i.e., one RF switch outputs the RF signals that are supplied to its input terminal to the RF switch at next stage, and the other RF switch outputs the RF signals that are supplied to its input terminals to the grounding resistance. For the set of RF switches at the last stage, one RF switch outputs the RF signals which are supplied to its input terminals to the output terminal of the RF switch unit, and the other RF switch outputs the RF signals that are supplied to its input terminals to the grounding resistance. In the embodiment as shown in FIG. 6, the RF switch 1, RF switch 2 and RF switch 3 for directly receiving RF signals input from the outside are at the first stage; the RF switch 4 is at the second stage, or the last stage; the remaining RF switch 3 at the first stage is used as a second-stage RF switch to work with RF switch 4 for selecting one channel from among the two channels of the RF input signals and emitting the signals to the output terminal of the RF switch unit, and outputting the other channel of the RF signal to the grounding resistance.

In the RF switch unit shown in FIG. 6, four RF switches are used. The present invention can also employ the RF unit as shown in FIG. 7 in which only three RF switches are used, which further reduces the cost.

Figure 7:
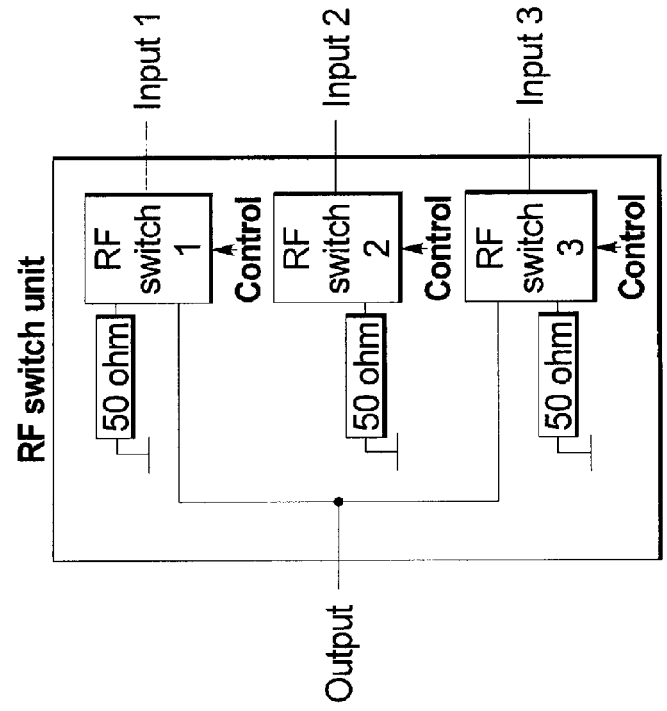
FIG. 7 is a schematic structure diagram of still another RF switch device in an embodiment according to the present invention.

Referring to FIG. 7, the RF switch unit comprises three RF switches, and the input terminal of each RF switch is used as the input terminal of the RF switch unit for receiving the RF signals, and the output terminals of each RF switch are respectively connected with the input terminal of the RF switch unit and the grounding resistance. As shown in FIG. 7, three channels of input signals are inputted into the RF switch 1, RF switch 2 and RF switch 3, respectively, and the control terminal controls the output of the RF signal received by one of the RF switches while outputting the two channels of RF signals received by the remaining two RF switches to the grounding resistance. If more RF switches are used, the input terminal of each RF switch receives the RF signals, and two input terminals are connected with the input terminal of the RF switch unit and the grounding resistance, respectively. The control terminal controls the output of the RF signals received by one of the RF switches while outputting the RF signals received by the remaining RF switches to the grounding resistance.

In the embodiments of the present invention, various methods can be used to achieve the connection between multiple channels of the system plug and the input terminals of the RF switch unit in the RF switch device. For example, the input terminals of RF switch unit can be directly connected with multiple channels of the system plug. The RF switch device can also be equipped with ports corresponding to the system plug, and multiple input terminals of the RF switch unit within the RF switch device can be connected with multiple channels, so as to achieve the connection between the multiple channels of the system plug and the input terminals of the RF switch unit. The connections between the channels of the system plug and the input terminals of the RF switch unit in the RF switch device can be fixed, or adjustable.

The embodiment in which the RF switch device is used to transmit the RF signals under conditions shown in FIG. 2 is described below.

Figure 8:
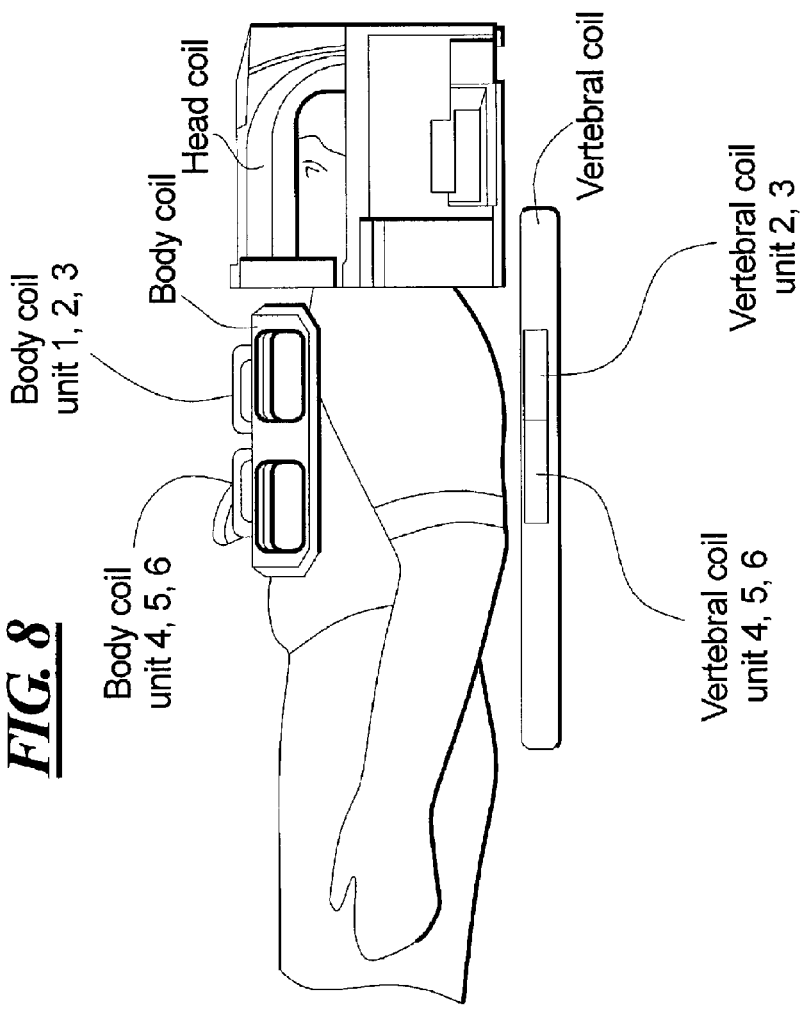
FIG. 8 is a schematic diagram indicating the location of the head coil, body coil and vertebral coil in an embodiment according to the present invention.

In the embodiment shown in FIG. 8, the neck and head of the patient need to be scanned. Therefore, the head coil, vertebral (spinal) coil and body coil need to be connected. In which case, the head coil is composed of 8 units, the vertebral coil is composed of 6 units and the body coil is composed of 6 units. Since the parts to be scanned are the head and neck, for the body coil and vertebral coil shown in FIG. 8, only the RF signals of the body coil units 1, 2 and 3 and the vertebral coil units 1, 2 and 3 need to be used, and the RF signals of the body coil units 4, 5 and 6, and the vertebral coil units 4, 5 and 6 are not required. In other words, it is possible not to input the RF signals received by the body coil units 4, 5 and 6 and the vertebral coil units 4, 5 and 6 into the imaging device.

In the embodiments according to the present invention, the coil plug channels can be arranged in a way corresponding to the coil units so as to input the RF signals in a receiver coil that need to be outputted and the RF signals in other coils that do not need to be emitted as outputs to the same RF switch unit as the final input of the RF switch device. In this way, the number of the RF switch units required can be decreased to further reduce the cost.

In which case, for the head coil, how the arrangement of the coil plug corresponds to that of the coil units is shown in Table 1.

TABLE 1

| | Channel arrangement of coil plug | | | | | | | |
|---|---|---|---|---|---|---|---|---|
| | Channel 1 | Channel 2 | Channel 3 | Channel 4 | Channel 5 | Channel 6 | Channel 7 | Channel 8 |
| Arrangement of coil units | Unit 1 | Unit 2 | Unit 3 | Unit 4 | Unit 5 | Unit 6 | Unit 7 | Unit 8 |

Figure 9:
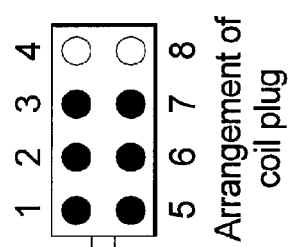
FIG. 9 is a schematic diagram indicating how the vertebral coil and vertebral coil plug in an embodiment according to the present invention are connected.

For the vertebral coil, how the arrangement of coil plug channels corresponds to that of the coil units is shown in Table 2, and the connection between the two is shown in FIG. 9. Since the vertebral coil only has 6 units and the coil plug has 8 channels so the channel 4 and channel 8 of the coil plug are idle.

TABLE 2

| | Channel arrangement of coil plug | | | | | | | |
|---|---|---|---|---|---|---|---|---|
| | Channel 1 | Channel 2 | Channel 3 | Channel 4 | Channel 5 | Channel 6 | Channel 7 | Channel 8 |
| Arrangement of coil units | Unit 1 | Unit 2 | Unit 3 | | Unit 4 | Unit 5 | Unit 6 | |

Figure 10:
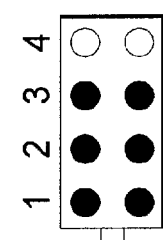
FIG. 10 is a schematic diagram indicating how the body coil and body coil plug in an embodiment according to the present invention are connected.

For the body coil, how the arrangement of the coil plug channel corresponds to that of the coil units is shown in Table 3, and the connection between the two is shown in FIG. 10. Similar to the vertebral coil, since the body coil only has 6 units, and the coil plug has 8 channels so the channel 4 and channel 8 of the coil plug are idle.

TABLE 3

| | Channel arrangement of coil plug | | | | | | | |
|---|---|---|---|---|---|---|---|---|
| | Channel 1 | Channel 2 | Channel 3 | Channel 4 | Channel 5 | Channel 6 | Channel 7 | Channel 8 |
| Arrangement of coil units | Unit 1 | Unit 2 | Unit 3 | | Unit 4 | Unit 5 | Unit 6 | |

In the embodiment, the coil plug of the head coil is connected with the system plug 1, the coil plug of the vertebral coil is connected with the system plug 3, the coil plug of the body coil is connected with the system plug 4, various system plugs are respectively connected with the RF switch device, and the system plug 1 and system plug 2 are connected to the same set of RF switch units in the RF switch device, and the system plug 3 and system plug 4 are connected to another set of RF switch units in the RF switch device. Here, each of the RF signals in a system plug that need to be outputted can be respectively inputted into different RF switch units, and the RF signals in other system plugs that do not need to be outputted can be inputted into these RF switch units so as to reduce the number of RF switch units.

The outputs of various RF switch units in the RF switch device are set as shown in Table 4 and Table 5. For RF signals supplied as inputs from the system plug 1 and the system plug 2, the RF signals supplied as inputs from channels of the system plug 1 are selected as the output signals of the RF switch device; for RF signals supplied as inputs from the system plug 3 and the system plug 4, the RF signals input from channels 1, 2, 3 and 4 of the system plug 3 and channels 4, 3, 2 and 1 of the system plug 4 are used as the output signals of the RF switch device.

According to the corresponding relations described above, it is understood that after the selection of the RF switch device, the output RF signals include the signals of 8 units of the head coil, signals of units 1, 2 and 3 of the vertebral coil, and signals of units 1, 2 and 3 of the body coil. These RF signals are transmitted to the receiver coil channel selector via the long RF cable between the RF switch device and the receiver coil channel selector. In the long 16-channel RF cables as shown in FIG. 2, only the cables corresponding to channel 4 of the system plug 3 and channel 4 of the system plug 4 are idle. Compared with the prior art as shown in FIG. 1, this significantly decreases the number of the idle long RF cables, thus reducing the cost of the system.

Figure 11:
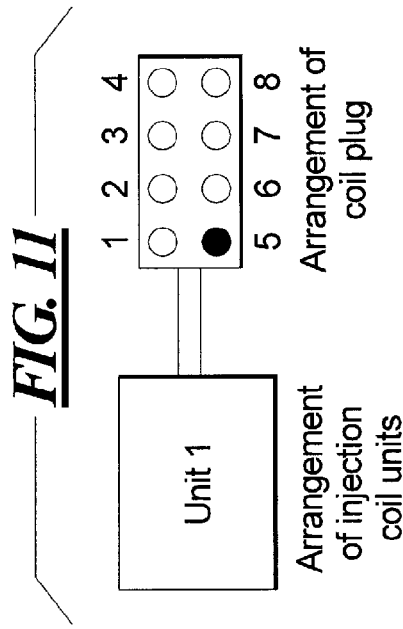
FIG. 11 is a schematic diagram indicating how the injection coil and injection coil plug in an embodiment according to the present invention are connected.

For example, in the conditions as shown in FIG. 2, the vertebral coil, body coil and injection coil can be simultaneously connected to the system. For an injection coil, the corresponding relation between channel arrangement of coil plug and arrangement of coil units is shown in Table 6, and their connection is shown in FIG. 11. Since the injection coil only has 1 unit and the coil plug has 8 channels so channels 1 to 4 and channels 6 to 8 of the coil plug are idle.

TABLE 6

| | Channel arrangement of coil plug | | | | | | | |
|---|---|---|---|---|---|---|---|---|
| | Channel 1 | Channel 2 | Channel 3 | Channel 4 | Channel 5 | Channel 6 | Channel 7 | Channel 8 |
| Arrangement of coil units | | | | Unit 1 | | | | |

In the embodiment, the coil plug of the vertebral coil is connected with the system plug 1, and the coil plug of the body coil is connected with the system plug 3, and the coil plug of the injection coil is connected with the system plug 2 or system plug 4. Similarly, each of the RF signals in a system plug that need to be emitted as outputs can be respectively supplied as inputs to different RF switch units, and the RF signals in other system plugs that need not be emitted as outputs also can be supplied as inputs to these RF switch units, thus reducing the number of RF switch units.

The outputs of various RF switch units of the RF switch device are set based on the relation shown in Table 7 and Table 8. In which case, for RF signals inputted from the system plug 1 and system plug 2, the RF signals inputted from channels 1, 2, 3, 5, 6, and 7 of the system plug 1 and channel 5 of the system plug 2 are selected as the output signals of the RF switch unit; for the RF signals input from the system plug 3 and system plug 4, the RF signals input from channels 1, 2, 3, 5, 6, and 7 of the system plug 3 and channel 5 of the system plug 4 are selected as the output signals of the RF switch unit. In the aforesaid setting, if the coil plug of the injection coil is connected with the system plug 2, then channel 5 of system plug 2 needs to be selected; if the coil plug of the injection coil is connected with the system plug 4, then channel 5 of the system plug 4 needs to be selected.

According to the corresponding relations described above, it is understood that after the selection of the RF switch

TABLE 4

| System plug 1 | Channel 1 | Channel 2 | Channel 3 | Channel 4 | Channel 5 | Channel 6 | Channel 7 | Channel 8 |
|---|---|---|---|---|---|---|---|---|
| Output | Plug 1 | Plug 1 | Plug 1 | Plug 1 | Plug 1 | Plug 1 | Plug 1 | Plug 1 |
| System plug 2 | Channel 4 | Channel 3 | Channel 2 | Channel 1 | Channel 8 | Channel 7 | Channel 6 | Channel 5 |

TABLE 5

| System plug 3 | Channel 1 | Channel 2 | Channel 3 | Channel 4 | Channel 5 | Channel 6 | Channel 7 | Channel 8 |
|---|---|---|---|---|---|---|---|---|
| Output | Plug 3 | Plug 3 | Plug 3 | Plug 3 | Plug 4 | Plug 4 | Plug 4 | Plug 4 |
| System plug 4 | Channel 8 | Channel 7 | Channel 6 | Channel 5 | Channel 4 | Channel 3 | Channel 2 | Channel 1 |

The present invention can employ the RF switch device to achieve the combinations of various coils used in the clinic.

device, the output RF signals include: signals of units 1, 2, 3, 4, 5, 6 of the vertebral coil; signals of units 1, 2, 3, 4, 5, 6 of the body coil; signals of unit 1 of the injection coil. These RF signals are transmitted to the receiver coil channel selector via the long RF cable between the RF switch device and the receiver coil channel selector. In the long 16-channel RF cable as shown in FIG. 2, only 3 cables are idle. Compared with the prior art as shown in FIG. 1, this greatly decreases the number of idle long RF cables thereby reducing the cost of the system and decreasing the complexity of the receiver coil channel selector.

TABLE 7

| System plug 1 | Channel 1 | Channel 2 | Channel 3 | Channel 4 | Channel 5 | Channel 6 | Channel 7 | Channel 8 |
|---|---|---|---|---|---|---|---|---|
| Output | Plug 1 | Plug 1 | Plug 1 | Plug 1 | Plug 1 | Plug 1 | Plug 1 | Plug 2 |
| System plug 2 | Channel 4 | Channel 3 | Channel 2 | Channel 1 | Channel 8 | Channel 7 | Channel 6 | Channel 5 |

TABLE 8

| System plug 3 | Channel 1 | Channel 2 | Channel 3 | Channel 4 | Channel 5 | Channel 6 | Channel 7 | Channel 8 |
|---|---|---|---|---|---|---|---|---|
| Output | Plug 3 | Plug 3 | Plug 3 | Plug 4 | Plug 3 | Plug 3 | Plug 3 | Plug 3 |
| System plug 4 | Channel 8 | Channel 7 | Channel 6 | Channel 5 | Channel 4 | Channel 3 | Channel 2 | Channel 1 |

Although modifications and changes may be suggested by those skilled in the art, it is the intention of the inventors to embody within the patent warranted hereon all changes and modifications as reasonably and properly come within the scope of their contribution to the art.

We claim as our invention:

1. An RF switch device, comprising:
at least four RF switch units, each RF switch unit comprising an output terminal and at least two input terminals, and said RF switch units being configured to select one channel of RF signals from among several channels of RF signals that are supplied as inputs to the respective input terminals for emission as an output from the respective output terminals; and
said at least four RF switch units being divided into at least two stages, and each RF switch comprising one input terminal and two output terminals, in which
the input terminal of the first-stage RF switch is used as the input terminal of said RF switch unit;
at the various stages preceding the last stage, one output terminal of each RF switch is connected with a grounding resistance, the other output terminal and one output terminal of another RF switch at the same stage are jointly connected with the input terminals of the same RF switch at the next stage; one RF switch of the two RF switches connecting to the same RF switch at the next stage outputs the RF signal inputted into its input terminal to the RF switch at the next stage, another RF switch outputs the RF signal inputted into its input terminal to the grounding resistance, and if the number of the RF switches at the same stage is odd, the remaining RF switch operates as the RF switch at the next stage;
at a last stage, the two output terminals of each RF switch are separately connected to the grounding resistance and the output terminal of said RF switch unit; one RF switch at the last stage outputs the RF signals input to its input terminal to the output terminal of said RF switch unit, and the other RF switch outputs the RF signals input to its input terminal to the grounding resistance.

2. The RF switch device as claimed in claim 1, wherein in that said RF switch unit comprises an RF switch and the RF switch comprises two input terminals and one output terminal, in which the input terminals of the RF switch are used as the input terminals of said RF switch unit, the output terminal of the RF switch is used as the output terminal of said RF switch unit, and when the RF unit selects one channel of the RF signals from the RF signals which are input to its input terminals for output from its output terminal.

3. The RF switch device as claimed in claim 2, wherein each RF switch comprises a control terminal that controls relations between the input and output of that RF switch dependent on a control signal supplied thereto.

4. The RF switch device as claimed in claim 1 wherein at least two sets of RF signals are supplied as inputs to one set of the RF switch units in said RF switch device, the channels of said RF signals are respectively inputted into one input terminal of said set of RF switch units, and said set of the RF switch units selects at least one set of RF signals from the input RF signals for emission in part or in full as an output.

5. A magnetic resonance imaging system comprising:
an imaging device and at least two system plugs connecting to a receiver coil;
an RF switch device comprising an output terminal and at least two input terminals, and said RF switch units being configured to select one channel of RF signals from among several channels of RF signals that are supplied as inputs to the respective input terminals for emission as an output from the respective output terminals, the input terminals of said RF switch units in the RF switch device being respectively connected with one channel of signals of said system plugs, and the output terminal of said RF switch unit being connected to said imaging device; and
the RF signals from at least two system plugs being supplied as inputs to one set of the RF switch units in said RF switch device, and the set of the RF switch units being configured to select the RF signals of at least one system plug from the RF signals supplied as inputs for emission at said output terminals in part or in full.

6. The magnetic resonance imaging system as claimed in claim 5, comprising a receiver coil channel selector, connected between said RF switch device and the imaging device, configured to select the RF signal suitable for said imaging device from the RF signals which are outputted from said RF switch device and outputs the signal to said imaging device.

* * * * *